(12) United States Patent
Inoue et al.

(10) Patent No.: US 6,211,059 B1
(45) Date of Patent: Apr. 3, 2001

(54) METHOD OF MANUFACTURING SEMICONDUCTOR DEVICE HAVING CONTACTS WITH DIFFERENT DEPTHS

(75) Inventors: Ken Inoue; Masayuki Hamada, both of Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/429,479

(22) Filed: Oct. 29, 1999

(51) Int. Cl.[7] .................................................. H01L 21/4763
(52) U.S. Cl. ........................ 438/620; 438/624; 438/629; 438/634
(58) Field of Search ...................................... 438/618, 620, 438/622, 624, 629, 634

(56) References Cited

U.S. PATENT DOCUMENTS

| | | | |
|---|---|---|---|
| 4,753,709 | * | 6/1988 | Welch et al. .......................... 438/618 |
| 5,010,039 | * | 4/1991 | Ku et al. ................................. 438/620 |
| 5,275,963 | * | 1/1994 | Cederbaum et al. ................. 438/622 |
| 5,451,543 | * | 9/1995 | Woo et al. .............................. 438/622 |

FOREIGN PATENT DOCUMENTS

| | | |
|---|---|---|
| 8-203872 | 8/1996 | (JP) . |
| 9-17862 | 1/1997 | (JP) . |
| 9-116014 | 5/1997 | (JP) . |
| 9-266252 | 10/1997 | (JP) . |
| 10-154752 | 6/1998 | (JP) . |

\* cited by examiner

*Primary Examiner*—T. N. Quach
(74) *Attorney, Agent, or Firm*—Young & Thompson

(57) ABSTRACT

A semiconductor device is manufactured in accordance with the following steps. A prospective lower interconnection layer is formed on a substrate, and is patterned to form a lower interconnection. A first nitride film is formed on the entire surface. A first interlevel insulating film is formed on the entire surface of the first nitride film. A prospective upper interconnection layer is formed on the first interlevel insulating film, and is patterned to form an upper interconnection. A second nitride film is formed on the entire surface. The second nitride film is removed by patterning where a contact reaching the lower interconnection is to be formed. A second interlevel insulating film is formed on the entire surface. A plurality of contact holes are formed simultaneously to have different depths and reach the first and second nitride films respectively formed on the lower and upper interconnections. The first and second nitride films located at bottoms of the contact holes are etched simultaneously to form a plurality of contact holes which have different depths and reach the lower and upper interconnections, simultaneously.

10 Claims, 4 Drawing Sheets

METHOD OF MANUFACTURING SEMICONDUCTOR DEVICE HAVING CONTACTS WITH DIFFERENT DEPTHS

BACKGROUND OF THE INVENTION

1. Field of the Invention

The present invention relates to a semiconductor device manufacturing method and, more particularly, to a method of manufacturing a semiconductor device in which a plurality of contact holes having largely different depths can be formed simultaneously to provide good electrical characteristics.

2. Description of the Prior Art

The first prior art concerning a contact formation process known as one of semiconductor device manufacturing methods will be described with reference to the sectional view shown in FIG. 1.

The semiconductor device having a section shown in FIG. 1 shows a state after it is manufactured in accordance with the following manufacturing method.

A field oxide film 301 serving as an isolation region, and a gate electrode 302 are sequentially formed on a silicon substrate by patterning with a known scheme. An oxide film is formed on the entire surface of the resultant structure, and is etched back by dry etching back to form a side wall 303 on the side wall of the gate electrode 302.

Subsequently, a diffusion layer 304 is formed by known ion implantation and annealing. A first interlevel insulating film 305 is formed on the entire surface, and its upper surface is planarized by CMP as a known planarization scheme. After the planarization, a prospective upper interconnection film is deposited with a known scheme and patterned to form an upper interconnection 306. A second interlevel insulating film 307 is deposited on the entire surface, and its upper surface is planarized by CMP again. A resist (not shown) for forming contact holes is formed on the planarized second interlevel insulating film 307 and is patterned by known photolithography. After contact holes 308a and 308b are formed by dry etching, the resist is removed. A contact 308 is formed in each of the contact holes 308a and 308b.

The second prior art concerning the contact formation process will be described with reference to the sectional views shown in FIGS. 2A and 2B.

In the semiconductor device having sections shown in FIGS. 2A and 2B, the same process as that described concerning FIG. 1 described above is performed until formation of a diffusion layer 404 (corresponding to the diffusion layer 304 of FIG. 1). The process of FIGS. 2A and 2B is different from that described with reference to FIG. 1 in that after the diffusion layer 404 is formed, a nitride film 409 is formed on the entire surface of the structure. After that, the same process as that described in FIG. 1 is performed. The nitride film 409 is formed on the entire surface in this manner after the diffusion layer 404 is formed. If the diffusion layer 404 and a gate electrode 402 form a step that allows formation of contact holes 408a and 408b on them, as shown in FIGS. 2A and 2B, then contact holes 408a and 408b can be respectively formed on the diffusion layer 404 and gate electrode 402 simultaneously with a sufficiently large process margin. In this case, when the selectivity of dry etching of the nitride film 409 with respect to the oxide film (interlevel insulating film) is increased, contact holes can be formed once to reach the nitride film 409, as shown in FIG. 2A. After that, the nitride film 409 is etched, so that the two contact holes 408a and 408b having different depths can be completed, as shown in FIG. 2B. A contact 408 is formed in each of the contact holes 408a and 408b.

As semiconductor devices shrink in feature size and increase in integration degree, a plurality of contact holes having largely different depths must be formed, leading to a problem.

In the prior art described with reference to FIG. 1, etching for the contact hole 308b that reaches the upper interconnection 306 ends sooner than for the contact hole 308a that reaches the diffusion layer 304. Therefore, while etching in the process of forming the contact hole 308a, the upper interconnection 306 may be etched either partially or entirely so the contact hole 308b may extend through the upper interconnection 306. This leads to disconnection of the contact portion and an increase in contact resistance, so good electrical characteristics cannot be obtained.

The third prior art concerning the contact formation process will be described with reference to the sectional view shown in FIG. 3. A contact hole 508c as shown in FIG. 3 that reaches an upper interconnection 506 must be formed to have a depth largely different from those of other contact holes 508a and 508b. It is accordingly difficult to form contact holes for a diffusion layer 504, a gate electrode 502, and the upper interconnection 506 simultaneously. A contact 508 is formed in each of the contact holes 508a, 508b, and 508c.

Under these circumstances, a method that can form a plurality of contacts having largely different depths is sought for. As a countermeasure against the above problem, it is conventionally known to form a nitride film or the like on the upper surface of an interconnection.

In a hybrid DRAM/Logic semiconductor product in which a self-align-silicide or salicide process is performed, if a nitride film is formed on an interconnection, the salicide process cannot be done on the interconnection.

SUMMARY OF THE INVENTION

The present invention has been made in consideration of the above situation, and has as its object to provide, in a semiconductor device manufacturing method having a salicide process, a method of manufacturing a semiconductor device in which a plurality of contact holes having largely different depths can be formed simultaneously to provide good electrical characteristics.

In order to achieve the above object, a semiconductor device manufacturing method according to the present invention has the following steps.

That is, according to the first aspect, there is provided a semiconductor device manufacturing method comprising the steps of: forming a prospective lower interconnection layer on a substrate and patterning the prospective lower interconnection layer to form a lower interconnection; forming a first nitride film on an entire surface; forming a first interlevel insulating film on an entire surface of the first nitride film; forming a prospective upper interconnection layer on the first interlevel insulating film and patterning the prospective upper interconnection layer to form an upper interconnection; forming a second nitride film on an entire surface; removing by patterning that portion of the second nitride film, where a contact reaching the lower interconnection is to be formed; forming a second interlevel insulating film on an entire surface; simultaneously forming a plurality of contact holes which have different depths and reach the first and second nitride films respectively formed on the lower and upper interconnections; and etching the first and second nitride films located at bottoms of the contact holes simultaneously to form a plurality of contact holes which have different depths and reach the lower and upper interconnections, simultaneously.

According to the second aspect, there is provided a semiconductor device manufacturing method comprising the steps of: forming a prospective lower interconnection layer on a substrate; forming a first nitride film on an entire surface; patterning the prospective lower interconnection layer and the first nitride film simultaneously to form a bi-layer structure comprised of a lower interconnection and the first nitride film; forming a first interlevel insulating film on an entire surface; forming a prospective upper interconnection layer on the first interlevel insulating film and patterning the prospective upper interconnection layer to form an upper interconnection; forming a second nitride film on an entire surface; removing by patterning that portion of the second nitride film, where a contact reaching the lower interconnection is to be formed; forming a second interlevel insulating film on an entire surface; simultaneously forming a plurality of contact holes which have different depths and reach the first and second nitride films respectively formed on the lower and upper interconnections; and etching the first and second nitride films located at bottoms of the contact holes simultaneously to form a plurality of contact holes which have different depths and reach the lower and upper interconnection, simultaneously.

According to the third aspect, there is provided a semiconductor device manufacturing method comprising the steps of: forming a prospective lower interconnection layer on a substrate and patterning the prospective lower interconnection layer to form a lower interconnection; forming a first nitride film on an entire surface; forming a first interlevel insulating film on an entire surface; forming a prospective upper interconnection layer on an entire surface of the first interlevel insulating film; forming a second nitride film on an entire surface of the prospective upper interconnection layer; patterning the prospective upper interconnection layer and the second nitride film simultaneously to form a bi-layer structure comprised of an upper interconnection and the second nitride film; forming a second interlevel insulating film on an entire surface; simultaneously forming a plurality of contact holes which have different depths and reach the first and second nitride films respectively formed on the lower and upper interconnections; and etching the first and second nitride films located at bottoms of the contact holes simultaneously to form a plurality of contact holes which have different depths and reach said lower and upper interconnection, simultaneously.

According to the first to third aspects described above, silicidation can be performed on an upper surface of the lower interconnection, and this silicidation is performed by sputtering cobalt or titanium.

According to the fourth aspect, there is provided a semiconductor device manufacturing method comprising the steps of: forming a prospective lower interconnection layer on a substrate and patterning the prospective lower interconnection layer to form a lower interconnection; sputtering the lower interconnection with cobalt or titanium; annealing the lower interconnection sputtered with cobalt or titanium; removing unreacted cobalt or titanium by etching; performing a re-process of annealing at a temperature higher than in annealing the lower interconnection; forming a first nitride film on an entire surface; forming a first interlevel insulating film on an entire surface of the first nitride film; forming a prospective second upper interconnection layer on the first interlevel insulating film and patterning the prospective second upper interconnection layer to form an upper interconnection; forming a second nitride film on an entire surface to cover the upper interconnection; removing by patterning that portion of the second nitride film, where a contact hole reaching the lower interconnection is to be formed; forming a second interlevel insulating film on an entire surface; simultaneously forming a plurality of contact holes which have different depths and reach the first and second nitride films respectively formed on the lower and upper interconnections; and etching the first and second nitride films located at bottoms of the contact holes simultaneously to form a plurality of contact holes which have different depths and reach the lower and upper interconnections, respectively.

In this manner, according to the present invention, the first and second nitride films are respectively formed on the upper and lower interconnections formed in the semiconductor device. Etching is performed once to reach the first and second nitride films respectively formed in the lower and upper interconnections such that the selectivity of the nitride film with respect to the oxide film (interlevel insulating film) is high. After that, the nitride films located at the bottoms of the respective contact holes are etched, thereby forming contact holes. Therefore, a plurality of contact holes having largely different depths can be formed simultaneously.

In the salicide process, since a nitride film is formed on the entire surface after the salicide process, contact holes having largely different depths can be formed simultaneously without influencing the salicide process, thereby obtaining good electrical characteristics. In particular, after the interconnection is formed, the salicide process is performed and then the nitride film is formed. Therefore, the nitride film will not adversely influence the salicide process.

As is apparent from the aspects described above, with the semiconductor manufacturing method according to the present invention, even when the salicide process is performed, a plurality of contact holes having largely different depths can be formed simultaneously, to provide a semiconductor device having good electrical contact characteristics.

The above and many other objects, features and advantages of the present invention will become manifest to those skilled in the art upon making reference to the following detailed description and accompanying drawings in which preferred embodiments incorporating the principle of the present invention are shown by way of illustrative examples.

DETAILED DESCRIPTION OF THE PREFERRED EMBODIMENTS

Several preferred embodiments of the present invention will be described with reference to the accompanying drawings.

First Embodiment

Figure 1:
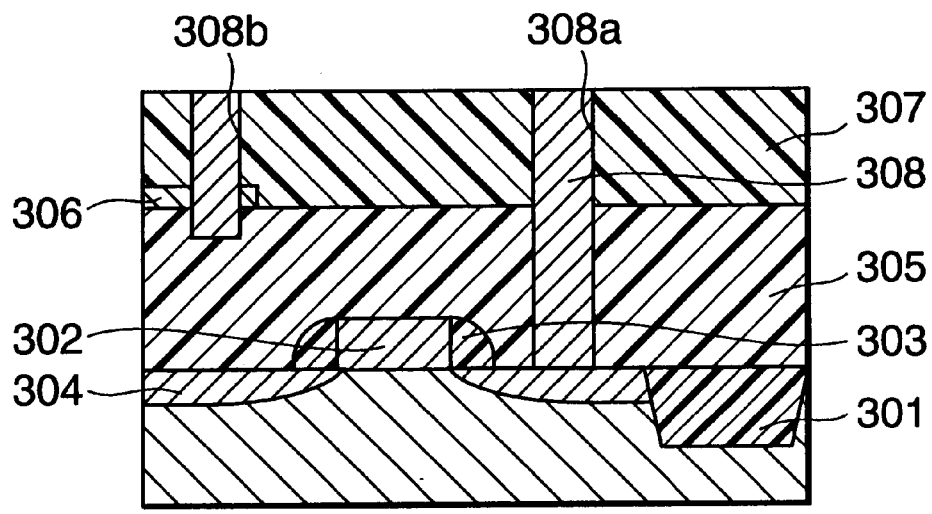
FIG. 1 is a sectional view showing a semiconductor device obtained with the first conventional manufacturing method.
Figure 3:
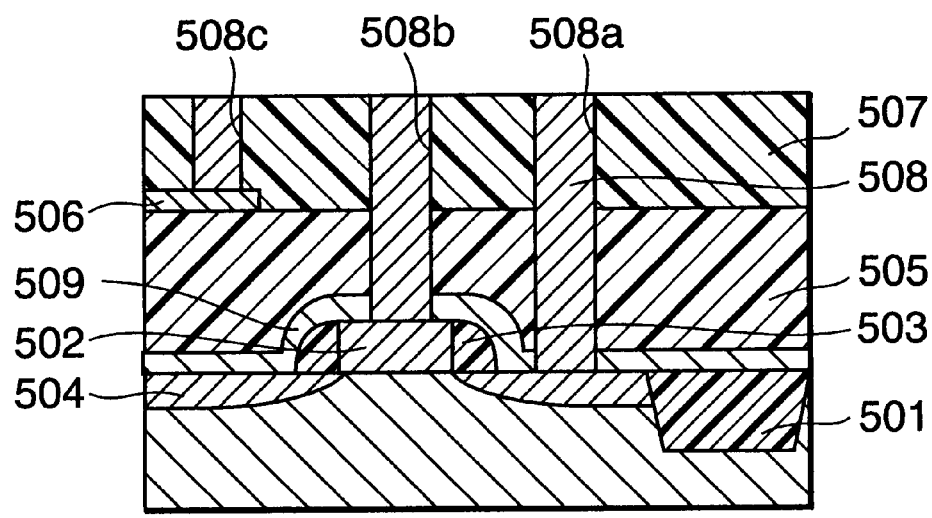
FIG. 3 is a sectional view showing a semiconductor device obtained with the third conventional manufacturing method.
Figure 2A:
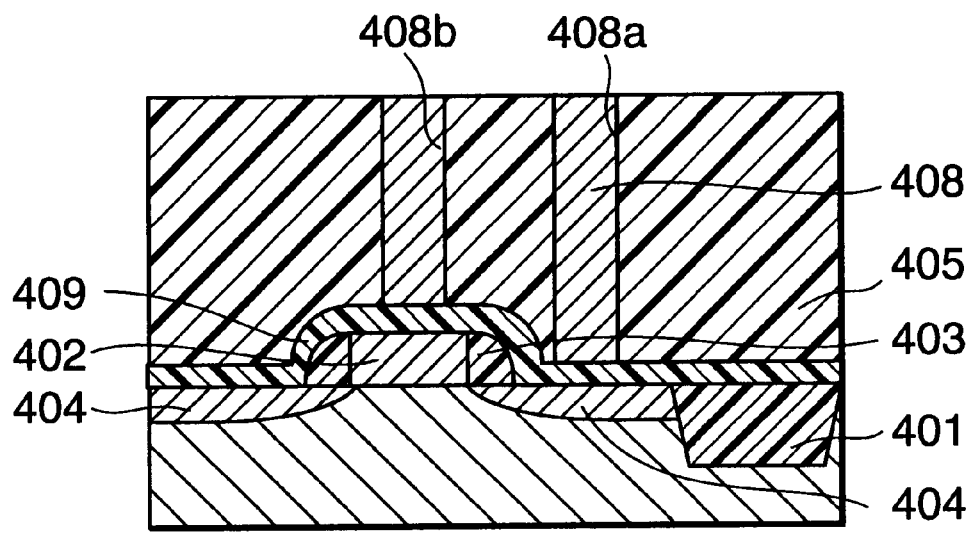
FIGS. 2A and 2B are sectional views showing a semiconductor device, obtained with the second conventional manufacturing method, in the order of its manufacturing steps.
Figure 2B:
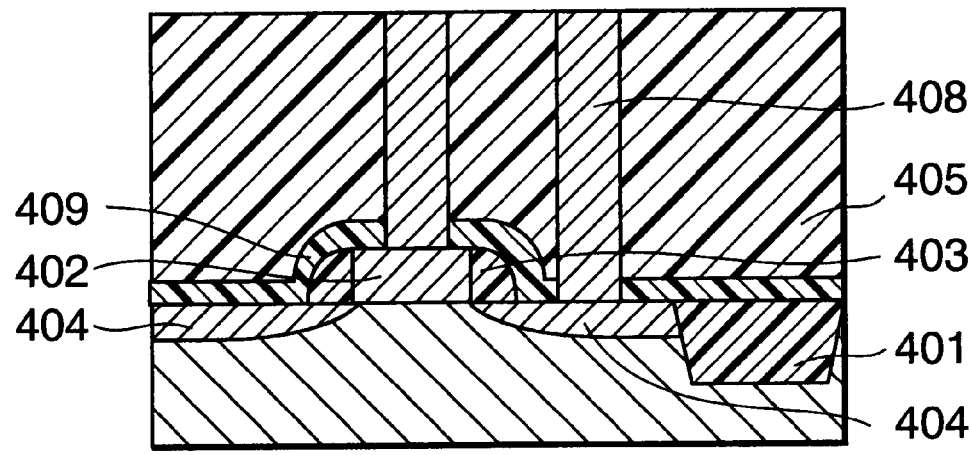
Figure 4A:
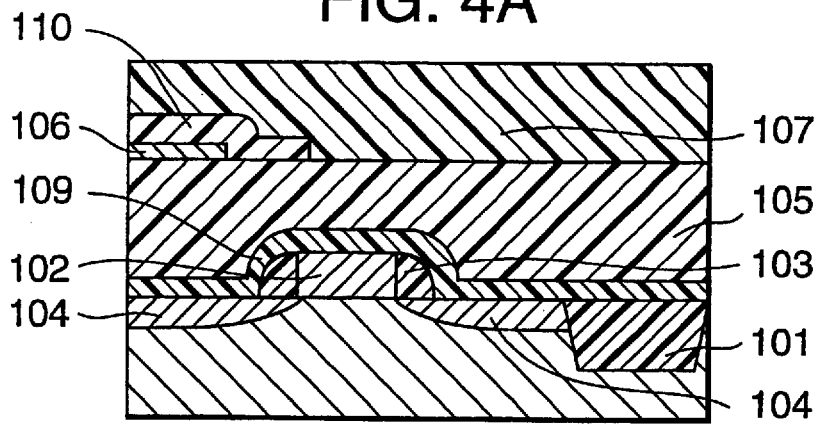
FIGS. 4A, 4B, and 4C are sectional views showing a semiconductor device, obtained with the manufacturing method according to the first embodiment of the present invention, in the order of its manufacturing steps.

The first preferable embodiment of the present invention will be described with reference to FIGS. 4A to 4C. The semiconductor device shown in the sectional view of FIG. 4A shows a state after it is manufactured in accordance with the following manufacturing method.

A field oxide film 101 serving as an isolation region, and a gate electrode 102 serving as a lower interconnection are sequentially formed on a silicon substrate by a known scheme and patterning. The gate electrode 102 has a polycide structure of, e.g., tungsten silicide and doped polysilicon. After the field oxide film 101 and gate electrode 102 are sequentially formed, an oxide film is formed on the entire surface of the resultant structure, and is etched back by known dry etching back to form a side wall 103 on the side wall of the gate electrode 102.

Subsequently, a diffusion layer 104 is formed on the upper surface of the silicon substrate by known ion implantation and annealing. After that, a first nitride film 109 is formed on the entire surface. A first interlevel insulating film (oxide film) 105 is formed on the entire surface of the first nitride film 109, and its upper surface is planarized by CMP as a known planarization scheme. After the planarization, a prospective upper interconnection film is deposited and patterned with a known scheme to form an upper interconnection 106. A second nitride film 110 is formed on the entire surface of the upper interconnection 106. For example, the upper interconnection is made of doped polysilicon. After that, the second nitride film 110 is removed by a known scheme, i.e., photolithography and dry etching, or wet etching, where a plurality of (two in this case) contact holes respectively reaching the diffusion layer 104 and gate electrode 102 are to be formed. Furthermore, a second interlevel insulating film 107 is deposited on the entire surface of the resultant structure, and its upper surface is planarized by CMP.

Figure 4B:
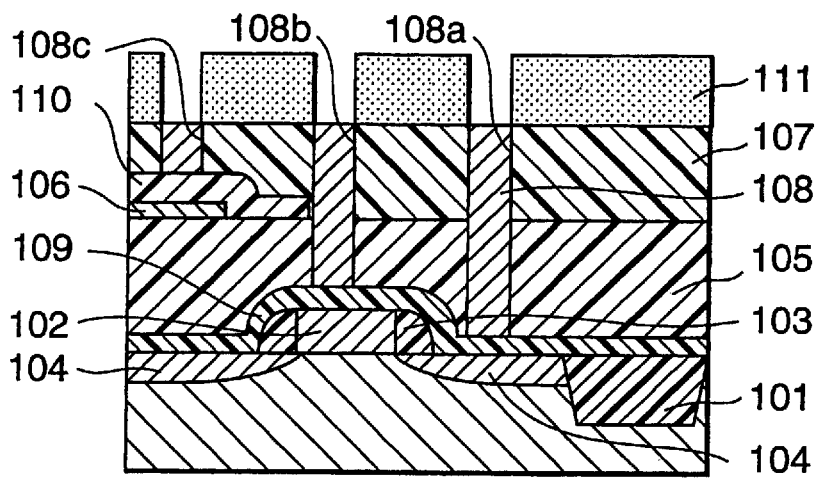

As shown in FIG. 4B, a resist is patterned by photolithography as a known scheme to form contact holes. A plurality of (three in this case) contact holes 108a, 108b, and 108c having different depths are formed on the diffusion layer 104, gate electrode 102, and second nitride film 110, respectively, by dry etching. The contact holes 108a and 108b reach the first nitride film 109 located on the diffusion layer 104 and gate electrode 102, while the contact hole 108c reaches the second nitride film 110 located on the upper interconnection 106. Dry etching for the respective contact holes is performed such that the nitride film has a high selectivity with respect to the oxide film.

Figure 4C:
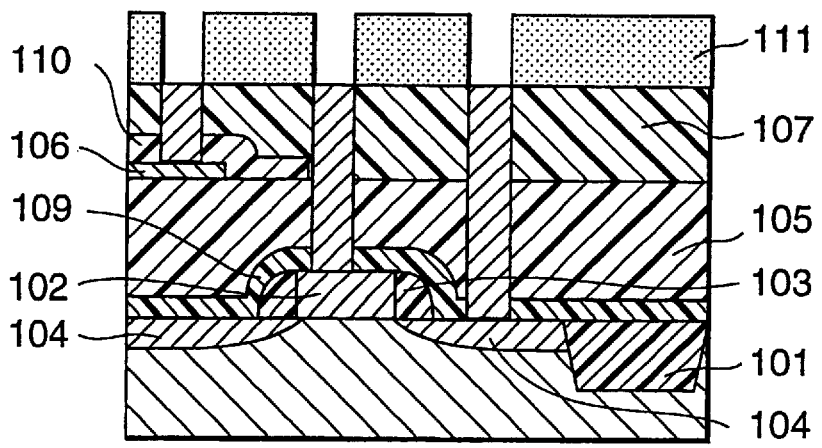

Subsequently, as shown in FIG. 4C, the first and second nitride films 109 and 110 located at the bottoms of the respective contact holes are etched simultaneously by changing etching conditions to simultaneously complete the plurality of (three in this case) contact holes 108a, 108b, and 108c which have different depths and respectively reach the diffusion layer 104, gate electrode 102, and upper interconnection 106 (FIG. 4C). If etching is performed such that the second nitride film has a larger thickness than that of the first nitride film, the etching margin increases obviously. The thickness ratio of the first nitride film to the second nitride film depends on the etching conditions, and the depths and diameters of contact holes. Therefore, the etching conditions, and the depths and diameters of contact holes must be optimized.

With the above process, contact holes having largely different depths can be formed simultaneously.

Second Embodiment

Figure 5A:
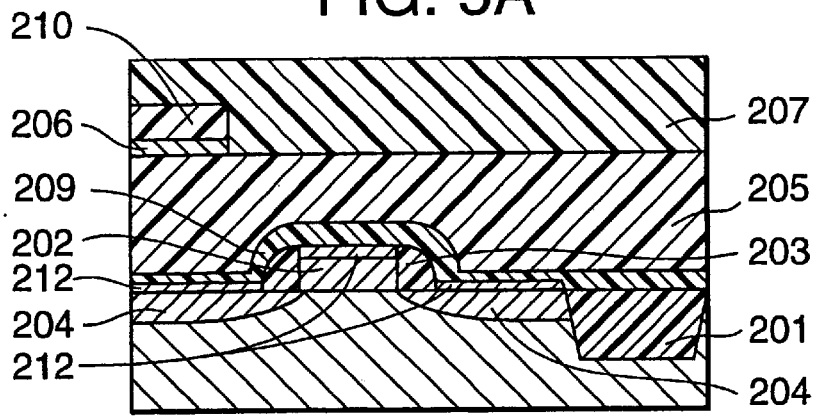
FIGS. 5A, 5B, and 5C are sectional views showing a semiconductor device, obtained with the manufacturing method according to the second embodiment of the present invention, in the order of its manufacturing steps.

The second preferable embodiment of the present invention will be described with reference to FIGS. 5A to 5C. The semiconductor device shown in the sectional view of FIG. 5A shows a state after it is manufactured in accordance with the following manufacturing method.

A field oxide film 201 serving as an isolation region, and a gate electrode 202 serving as a lower interconnection are sequentially formed on a silicon substrate by a known scheme and patterning. After the field oxide film 201 and gate electrode 202 are formed sequentially, an oxide film is formed on the entire surface of the resultant structure, and is etched back by known dry etching back to form a side wall 203 on the side wall of the gate electrode 202. Also, a diffusion layer 204 is formed on the upper surface of the silicon substrate by known ion implantation and annealing. In this case, since ion implantation progresses into polysilicon of the gate electrode 202 as well, the gate electrode 202 is doped.

Subsequently, the salicide process as a known scheme is performed to form a silicide layer 212 on the gate electrode 202 and diffusion layer 204. A first nitride film 209 is formed on the entire surface of the resultant structure. After that, a first interlevel insulating film (oxide film) 205 is formed on the entire surface of the first nitride film 209, and its upper surface is planarized by CMP as a known planarization scheme.

A film that forms a prospective upper interconnection 206, and a second nitride film 210 are sequentially formed on the entire surface. The upper interconnection 206 is made of doped polysilicon. After that, a bi-layer structure comprised of the upper interconnection 206 and second nitride film 210 is formed by photolithography and dry etching as known schemes. A second interlevel insulating film 207 is formed on the entire surface of the resultant structure, and its upper surface is planarized by CMP.

Figure 5B:
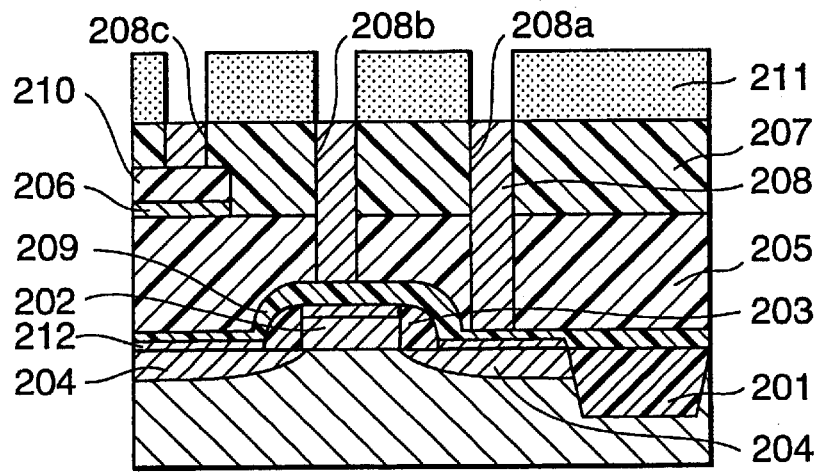

As shown in FIG. 5B, a resist 211 is patterned by photolithography as a known scheme to form contact holes. A plurality of (three in this case) contact holes 208a, 208b, and 208c are formed on the diffusion layer 204, gate electrode 202, and second nitride film 210, respectively, by dry etching. The contact holes 208a and 208b reach the first nitride film 209 located on the diffusion layer 204 and gate electrode 202, while the contact hole 208c reaches the second nitride film 210 located on the upper interconnection 206. Dry etching for the respective contact holes is performed such that the nitride film 209 and the like have a high selectivity with respect to the oxide film.

Figure 5C:
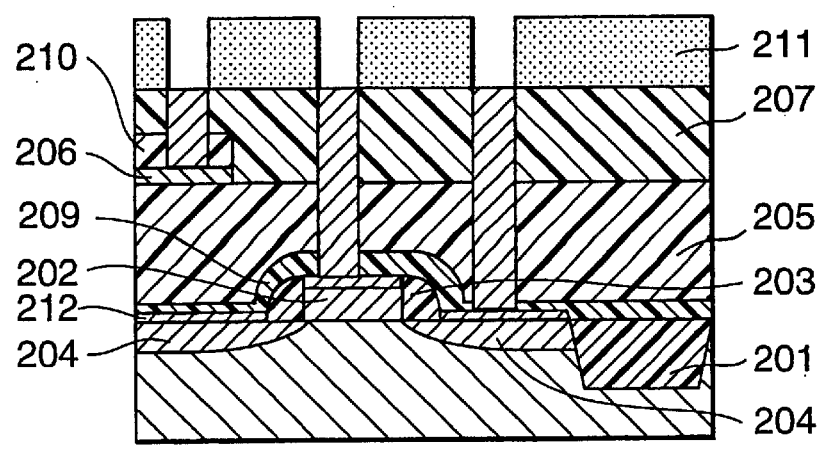

Subsequently, as shown in FIG. 5C, the first and second nitride films 209 and 210 located at the bottoms of the respective contact holes are etched simultaneously by changing etching conditions to simultaneously complete the plurality of (three in this case) contact holes 208a, 208b, and 208c which have different depths and respectively reach the diffusion layer 204, gate electrode 202, and upper interconnection 206. If etching is performed such that the second nitride film 210 has a larger thickness than that of the first nitride film 209, the etching margin increases obviously. The thickness ratio of the first nitride film 209 to the second nitride film 210 depends on the etching conditions, and the depths and diameters of contact holes. Therefore, the etching conditions, and the depths and diameters of the contact holes must be optimized.

With the above process, even if a salicide process is performed, contact holes having largely different depths can be formed simultaneously. When compared to the first embodiment, in the method according to the second embodiment, the photolithography process and dry or wet etching process, that aim at removing those portions of the second nitride film 210, where contact holes reaching the diffusion layer 204 and gate electrode 202 are to be formed, are omitted, simplifying the steps.

What is claimed is:

1. A semiconductor device manufacturing method comprising the steps of:

forming a prospective lower interconnection layer on a substrate and patterning said prospective lower interconnection layer to form a lower interconnection;

forming a first nitride film on an entire surface, of said lower interconnection forming a first interlevel insulating film on an entire surface of said first nitride film;

forming a prospective upper interconnection layer on said first interlevel insulating film and patterning said prospective upper interconnection layer to form an upper interconnection;

forming a second nitride film on an entire surface, of said upper interconnection removing by patterning that portion of said second nitride film, where a contact reaching said lower interconnection is to be formed;

forming a second interlevel insulating film on an entire surface, of said second nitride film simultaneously forming a plurality of contact holes which have different depths and reach said first and second nitride films respectively formed on said lower and upper interconnections; and etching said first and second nitride films located at bottoms of said contact holes simultaneously to form a plurality of contact holes which have different depths and reach said lower and upper interconnections, simultaneously.

2. A method according to claim 1, comprising the step of performing silicidation on an upper surface of said lower interconnection.

3. A method according to claim 2, wherein silicidation is performed by sputtering with cobalt or titanium.

4. A semiconductor device manufacturing method comprising the steps of:

forming a prospective lower interconnection layer on a substrate;

forming a first nitride film on an entire surface; of said prospective lower interconnection patterning said prospective lower interconnection layer and said first nitride film simultaneously to form a bi-layer structure comprised of a lower interconnection and said first nitride film;

forming a first interlevel insulating film on an entire surface; of said lower interconnection forming a prospective upper interconnection layer on said first interlevel insulating film and patterning said prospective upper interconnection layer to form an upper interconnection;

forming a second nitride film on an entire surface; of said upper interconnection removing by patterning that portion of said second nitride film, where a contact reaching said lower interconnection is to be formed;

forming a second interlevel insulating film on an entire surface, of said second nitride film simultaneously forming a plurality of contact holes which have different depths and reach said first and second nitride films respectively formed on said lower and upper interconnections; and etching said first and second nitride films located at bottoms of said contact holes simultaneously to form a plurality of contact holes which have different depths and reach said lower and upper interconnection, simultaneously.

5. A method according to claim 4, comprising the step of performing silicidation on an upper surface of said lower interconnection.

6. A method according to claim 5, wherein silicidation is performed by sputtering with cobalt or titanium.

7. A semiconductor device manufacturing method comprising the steps of:

forming a prospective lower interconnection layer on a substrate and patterning said prospective lower interconnection layer to form a lower interconnection;

forming a first nitride film on an entire surface; of said lower interconnection forming a first interlevel insulating film on an entire surface; of said first nitride film forming a prospective upper interconnection layer on an entire surface of said first interlevel insulating film;

forming a second nitride film on an entire surface of said prospective upper interconnection layer;

patterning said prospective upper interconnection layer and said second nitride film simultaneously to form a bi-layer structure comprised of an upper interconnection and said second nitride film;

forming a second interlevel insulating film on an entire surface; of said second nitride film simultaneously forming a plurality of contact holes which have different depths and reach said first and second nitride films respectively formed on said lower and upper interconnections; and etching said first and second nitride films located at bottoms of said contact holes simultaneously to form a plurality of contact holes which have different depths and reach said lower and upper interconnection, simultaneously.

8. A method according to claim 7, comprising the step of performing silicidation on an upper surface of said lower interconnection.

9. A method according to claim 8, wherein silicidation is performed by sputtering with cobalt or titanium.

10. A semiconductor device manufacturing method comprising the steps of:

forming a prospective lower interconnection layer on a substrate and patterning said prospective lower interconnection layer to form a lower interconnection;

sputtering said lower interconnection with cobalt or titanium;

annealing said lower interconnection sputtered with cobalt or titanium;

removing unreacted cobalt or titanium by etching;

performing a re-process of annealing at a temperature higher than in annealing said lower interconnection;

forming a first nitride film on an entire surface; of said lower interconnection forming a first interlevel insulating film on an entire surface of said first nitride film;

forming a prospective second upper interconnection layer on said first interlevel insulating film and patterning said prospective second upper interconnection layer to form an upper interconnection;

forming a second nitride film on an entire surface of said upper interconnection;

removing by patterning that portion of said second nitride film, where a contact hole reaching said lower interconnection is to be formed;

forming a second interlevel insulating film on an entire surface;

simultaneously forming a plurality of contact holes which have different depths and reach said first and second nitride films respectively formed on said lower and upper interconnections; and etching said first and second nitride films located at bottoms of said contact holes simultaneously to form a plurality of contact holes which have different depths and reach said lower and upper interconnections, respectively.

* * * * *